(12) United States Patent
Divakaruni et al.

(10) Patent No.: US 7,091,553 B2
(45) Date of Patent: Aug. 15, 2006

(54) TOP OXIDE NITRIDE LINER INTEGRATION SCHEME FOR VERTICAL DRAM

(75) Inventors: Ramachandra Divakaruni, Ossining, NY (US); Klaus Hummler, Apex, NC (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 11/109,443

(22) Filed: Apr. 19, 2005

(65) Prior Publication Data

US 2005/0196919 A1    Sep. 8, 2005

Related U.S. Application Data

(62) Division of application No. 10/605,438, filed on Sep. 30, 2003, now Pat. No. 6,972,266.

(51) Int. Cl.
*H10L 29/732* (2006.01)
(52) U.S. Cl. .................. 257/329; 257/302; 257/735; 257/E21.646; 257/E29.189
(58) Field of Classification Search .................. 257/68, 257/71, 735, 302, 329, E21.66, E21.678, 257/E21.691, E21.646, E27.084, E27.096, 257/E29.189
See application file for complete search history.

(56) References Cited

U.S. PATENT DOCUMENTS 6,258,659 B1    7/2001   Gruening et al.
6,509,226 B1    1/2003   Jaiprakash et al.
6,573,136 B1 *  6/2003   Hummler ..................... 438/242
6,620,676 B1    9/2003   Malik et al.
6,747,306 B1 *  6/2004   Dyer .......................... 257/302
6,790,739 B1    9/2004   Malik et al.
6,809,368 B1 * 10/2004   Divakaruni et al. ......... 257/302
2003/0160272 A1 * 8/2003  Mandelman et al. ........ 257/302
2003/0186502 A1 * 10/2003 Malik et al. ................ 438/242
2005/0014331 A1   1/2005  Yang et al.

* cited by examiner

*Primary Examiner*—George Fourson
*Assistant Examiner*—Joannie Adelle Garcia
(74) *Attorney, Agent, or Firm*—DeLio & Peterson, LLC; Kelly M. Nowak; Steven Capella (57) ABSTRACT

A process and intermediate DRAM structure formed by providing a substrate having an array of trenches containing trench capacitors underlying vertical transistors in an array area separated by isolation trenches residing in both array and support areas. A top oxide nitride (TON) liner is deposited over array and support areas so as to directly contact the fill in the isolation trenches. An array top oxide (ATO) is then deposited directly over the TON liner such that during subsequent processing, the TON protects the isolation trench oxide from any divot opening etches while maintaining the isolation trench oxide height fixed during the ATO process. In further processing the intermediate structure, ATO and TON are removed from the support area only, leaving remaining portions of both ATO and TON only in the array area, such that the TON liner separates the ATO from the isolation trench fill.

18 Claims, 7 Drawing Sheets

TOP OXIDE NITRIDE LINER INTEGRATION SCHEME FOR VERTICAL DRAM

BACKGROUND OF INVENTION

The present invention relates generally to semiconductor processing and, more particularly, to methods of processing array and support areas of a vertical transistor pass gate dynamic random access memory (DRAM).

A dynamic random access memory (DRAM) circuit usually includes an array of memory cells interconnected by a number of rows and columns. These rows are commonly referred to as wordlines (WLs) while the columns are referred to as bitlines (BLs). Activating selected ones of these wordlines and bitlines allows the reading of data from or the writing of data to memory cells.

Typically, a DRAM memory cell comprises a metal oxide semiconductor field effect transistor (MOSFET) connected to a capacitor, such as a vertical MOSFET having a trench capacitor. A vertical MOSFET is a transistor where a surface of the channel region of the transistor is generally perpendicular to the primary surface of the substrate. This perpendicular feature enables an effective cell size reduction with an increase in bit densities. As such, the use of vertical MOSFETs have been proposed to overcome the scalability limitations of planar MOSFET DRAM access transistors.

In vertical transistor DRAM chips, the process steps of the array and support areas of the chip are performed separately during manufacture. For example, in the formation of a memory cell in vertical MOSFET DRAM arrays, an array top oxide (ATO) is needed to isolate the passing word-lines from active areas on the substrate. An ATO layer is generally formed by two different methods as known in the art.

One such method for forming the ATO is referred to as a top oxide early (TOE) process. In TOE processing, an array top oxide area is formed with pad nitride being present in the support regions. Subsequently, this pad nitride is stripped in the support areas, a gate oxide is grown and then a gate poly is deposited. While this scheme has the advantage of completely decoupling the array and support processing, it is complex and requires many processing steps in the careful optimization of the location of the block masks required for formation of the ATO.

Another method for forming the ATO is referred to as a Top Oxide Late (TOL) process. In TOL processing, the ATO is deposited after the support gate oxidation and polysilicon deposition. While TOL processing reduces the number of processing steps and manufacturing costs, it undesirably changes the gate oxide during ATO deposition. In addition, the planarizing the ATO down to the gate polysilicon within the support regions can lead to undesirable residual patterns in the support region.

Another disadvantage with the above prior art techniques of forming ATO layers is that, in each method, the ATO is in direct contact with the isolation trench (IT) fill in the array area. During the subsequent steps of processing the array area, voids or divots may undesirably form in dense array areas which adversely affect production yields.

Consequently, a need continues to exist in the art for improved methods of forming ATO layers.

The present invention overcomes the above problems and deficiencies in the prior art by disclosing a simplified method of providing an ATO in a vertical MOSFET DRAM in a manner that reduces the number of processing steps, complexity and costs, while simultaneously improving production yield.

SUMMARY OF INVENTION

Bearing in mind the problems and deficiencies of the prior art, it is therefore an object of the present invention to provide an improved method of providing an array top oxide in a vertical MOSFET DRAM in a manner that reduces the number of processing steps, reduces costs and improves yield.

It is yet another object of the present invention to provide a method of providing an array top oxide in a vertical MOSFET DRAM whereby the height of the isolation trench in the support region of the structure is controlled by the initial isolation trench polishing step, rather than an additional array top oxide planarization step.

It is another object of the present invention to provide a method of providing an array top oxide in a vertical MOSFET DRAM having reduced processing steps.

A further object of the invention is to provide a method of providing an array top oxide in a vertical MOSFET DRAM that avoids risky processing steps that may planarize down to the gate polysilicon layer.

It is another object of the invention to provide a nitride layer between the Isolation Trench (IT) oxide and the Array Top Oxide (ATO). The nitride layer serves the purpose of protecting the IT oxide from divot opening etches and of keeping the IT oxide height fixed in the supports during the ATO process.

Yet another object of the present invention is to provide a nitride layer between the isolation trench oxide and the array top oxide for protecting the isolation trench oxide from divot opening etches while simultaneously maintaining the isolation trench oxide height fixed in the supports during the ATO process.

Still other objects and advantages of the invention will in part be obvious and will in part be apparent from the specification.

The above and other objects and advantages, which will be apparent to one of skill in the art, are achieved in the present invention, which, is directed to in a first aspect a method for processing a semiconductor device in a process for making electronic components. The method includes providing an integrated circuit structure, which, is in the process of being fabricated into a finished electronic component having an array area and a support area whereby the array area includes an array of trenches containing trench capacitors underlying vertical transistors separated by isolation trenches. A nitride liner is deposited over both array and support areas, such that it covers the isolation trenches, and then an array top oxide layer is deposited directly and entirely over the nitride liner in both the array and support areas. The array top oxide and nitride liner are then removed from the support area only, leaving remaining portions of both array top oxide and nitride liner only in the array area, such that the nitride liner separates the array top oxide layer from the isolation trench fill.

In this aspect, the array top oxide and nitride liner are removed from the support area using a first mask, which is subsequently removed, while the portions of both array top oxide and nitride liner removed from the array area using a second mask, which is also subsequently removed. In so doing, the first mask completely covers the array area only during processing of the support area, while the second mask completely covers the support area only during processing of the array area.

In a second aspect, the invention is directed to a method for fabricating a vertical MOSFET structure used in forming a DRAM. The method includes providing a substrate, preferably, a vertical MOSFET structure, that includes an array area and a support area. The array area has a trench capacitor and a vertical transistor and a surface comprising a gate oxide of at least one adjacent oxide isolation trench. The array area also includes an electrically conductive contact. The support area includes at least a portion of the adjacent oxide isolation trench. The method proceeds by depositing a nitride liner, preferably a silicon nitride layer known as a top oxide nitride liner, over the array and support areas such that the nitride liner directly contacts the oxide isolation trench fill. An array top oxide is then deposited directly over the entire nitride liner such that it contacts the nitride liner. Using a first mask, the array top oxide and nitride liner are removed from the support area, and then using a second mask, portions of both the array top oxide and nitride liner are removed from the array area, such that, remaining portions of the nitride liner are disposed between the array top oxide and the isolation trench, thereby isolating the same from each other. During this processing step, the electrically conductive contact is exposed such that the process for making the DRAM may continue.

In this second aspect, the method further includes planarizing a surface of the isolation trench fill to provide the isolation trench with a predetermined height, wherein the nitride liner is deposited over the planarized oxide isolation trench fill, prior to deposition of the array top oxide. This advantageously enables the control and maintenance of such predetermined height of the planarized isolation trench fill during the subsequent processing steps.

The top oxide nitride liner layer preferably comprises a silicon nitride layer, while the isolation trench preferably comprises an oxide isolation trench. The first mask is an etch support mask formed only over the array areas, while the second mask is an etch array mask formed only over the support areas. Both the first and second mask are formed by depositing first and second photo resist layers, respectively, which are subsequently developed and exposed to form the masks.

In a third aspect, the invention is directed to an intermediate DRAM structure that includes a substrate having an array area and a support area. An isolation region, preferably an oxide isolation trench, resides in both the array and the support areas, while an array top oxide and nitride liner, preferably, a top oxide nitride liner such as silicon nitride, reside in only the array area of the substrate. The nitride liner resides between the array top oxide and the isolation region thereby isolating such components from each other. The intermediate DRAM structure further includes an electrically conductive contact having an exposed surface within the array area only.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–7 of the drawings in which like numerals refer to like features of the invention. Features of the invention are not necessarily shown to scale in the drawings.

The present invention is directed to a method for manufacturing a variety of differing vertical MOSFET structures for vertical pass gate DRAM arrays. In so doing, it discloses a unique method for stripping silicon nitride, in both array and support regions of the substrate, by the consecutive utilization of two different photo masks. The present invention advantageously reduces the number of processing steps, improves control and maintenance of the support isolation trench height as well as avoids the risk of damaging support regions during the process of planarizing down to the gate polysilicon.

Figure 1:
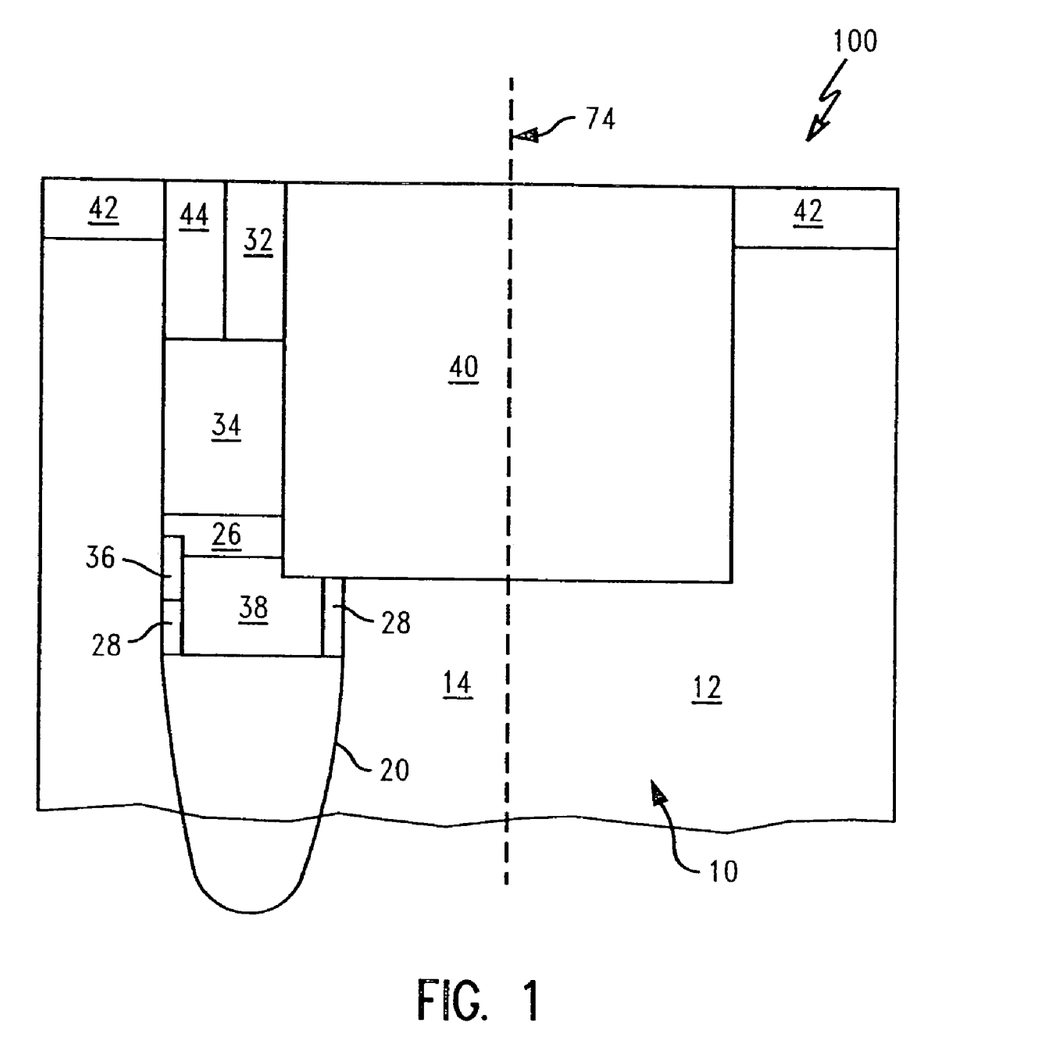
FIG. 1 is a partial cross-sectional view of both array and support areas of a DRAM device for processing in accordance with the invention.

In accordance with the invention, a cross-sectional view of a section of a DRAM 100 is shown in FIG. 1. DRAM 100 may be a vertical DRAM or an embedded DRAM that contains vertical MOSFET arrays formed in a semiconductor wafer substrate 10, preferably a silicon substrate, and having both an array area 14 and a support area 12 of the substrate 10, as delineated by dashed line 74.

The DRAM 100 is then provided with a plurality of vertical deep trenches within the array area 14. This may be accomplished by forming vertical deep trenches from a top surface down into the silicon substrate 10 by known patterning and etching techniques. Using known processing techniques, the bottom portion of each vertical trench is then provided with a trench collar 28 surrounding polysilicon fill 38. The trench collar preferably comprises oxide. Directly adjacent to the polysilicon fill 38 and above a portion of the trench collar is a contact 36, preferably of polysilicon. The oxide trench collar 28, polysilicon fill 38 and polysilicon contact 36 are completely covered with a trench top oxide layer 26 so as to form a trench capacitor within the lower portion of each trench which acts as the storage node. As shown in the drawings, trench 20 extends deep into the substrate 10, while the collar 28 is formed only in the top portion of the trench, i.e., within about 1 µm to about 2 µm from the top surface of the trench.

Above the trench capacitor, a vertical transistor is formed within each of the vertical trenches. This is accomplished by providing gate conductors 34, preferably of polysilicon, within the upper portion of each trench, i.e., above the trench top oxide layer 26, by known techniques. In so doing, the trench top oxide layer 26 insulates the gate conductor 34 in the upper portion of the trenches from the storage node in the lower portion of the trenches in the array area 14.

As shown in FIG. 1, isolation trenches 40 are formed in both array 14 and support 12 areas of DRAM 100. These isolation trenches 40 may be formed by a variety of techniques as known and used in the art. Deep trench inner sidewall spacers 44 may be formed in the array area 14, either before or after formation of the isolation trenches 40, within upper portions of the vertical deep trenches. For example, a portion of the gate polysilicon 34 within upper portions of the vertical deep trenches may be recessed to a desired depth by known techniques, and subsequently, deep trench inner sidewall spacers 44 are formed in these recessed portions also by known techniques. Preferably the deep trench inner sidewall spacers 44 comprise silicon nitride (SiN) or TEOS.

Upon completion of formation of sidewall spacers 44, a polysilicon gate contact 32 is formed in the remaining recessed portions of the deep trenches, adjacent thereto both the isolation trench 40 and the sidewall spacers 44 as is shown in FIG. 1. This may be accomplished by filling the remaining, unfilled recessed portions of the deep trenches with additional polysilicon material by known techniques, followed by known planarization steps, to result in the polysilicon gate contact 32.

The above steps of processing DRAM 100 proceed in a normal fashion. In accordance with the present invention, the below steps of subsequently processing DRAM 100 advantageously allow for controlling and maintaining the height of the isolation trench 40, as set by the final isolation trench polish step.

Referring again to FIG. 1, a pad silicon nitride layer 42 is deposited over a surface of the DRAM 100 and then planarized in a single process in both array and support areas such that the active areas of the substrate 10 in both array 14 and support 12 regions of DRAM 100 are covered by portions of the pad silicon nitride layer 42. Preferably, the pad silicon nitride layer 42 covers active silicon areas of the silicon substrate 10 in both array and support regions of the DRAM.

Figure 2:
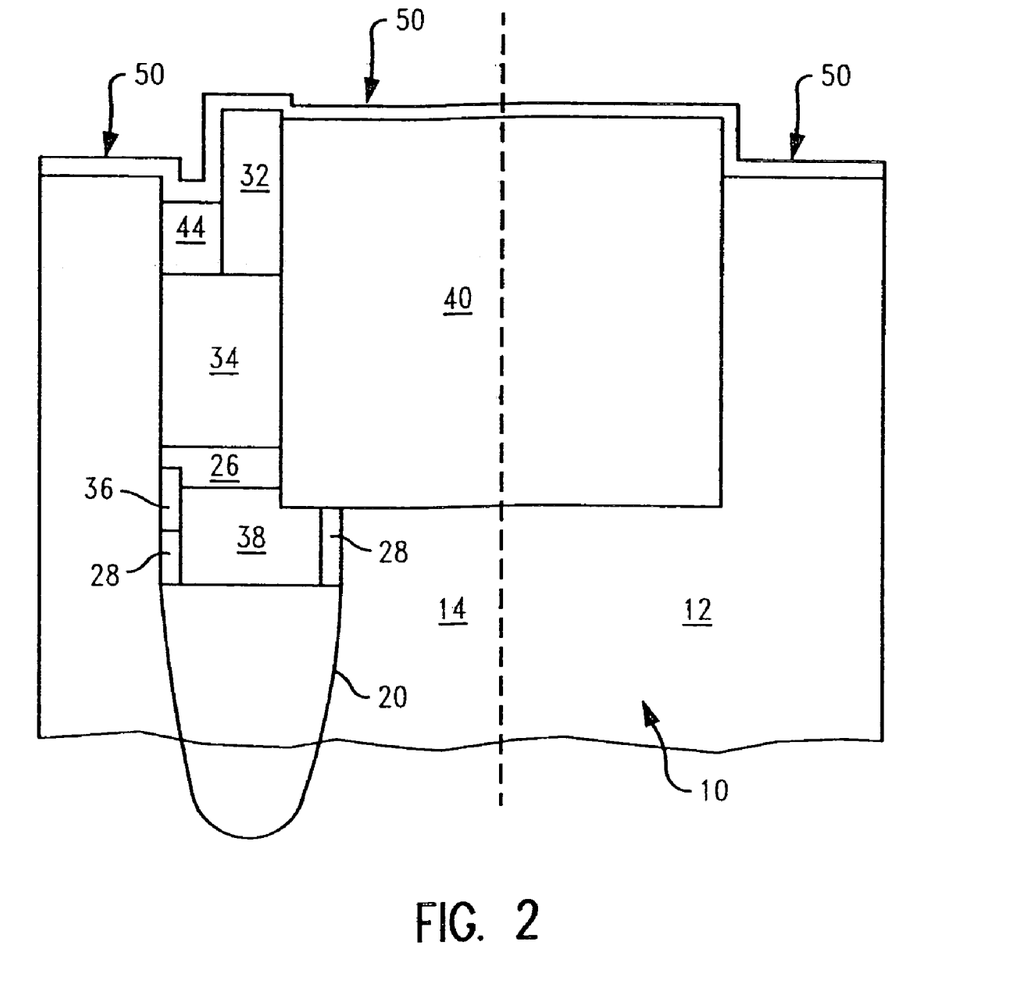
FIG. 2 is a partial cross-sectional view of FIG. 1 illustrating that the surface of the DRAM is recessed back in a single step in both array and support areas, and then a top oxide nitride layer is deposited over both array and support areas.

Once planarization is complete, the pad silicon nitride layer 42 is stripped in both support and array areas as shown in FIG. 2. In the embodiment of the invention where inner spacer 44 comprises silicon nitride, it too may be either completely or partially removed (as shown in FIG. 2) during this step of stripping the pad silicon nitride layer 42. The pad silicon nitride layer 42, and optionally all or portions of the inner spacers 44, may be stripped using known techniques, such as a hot phosphoric acid strip process. This common step of stripping pad silicon nitride layer 42 in both support and array areas may also form voids, i.e., divots, along the sidewalls of the isolation trench. These voids are then corrected for by filling the voids with additional silicon nitride material, and subsequently etching back any additional fill material. Array implants may then be formed in DRAM 100.

Figure 3A:
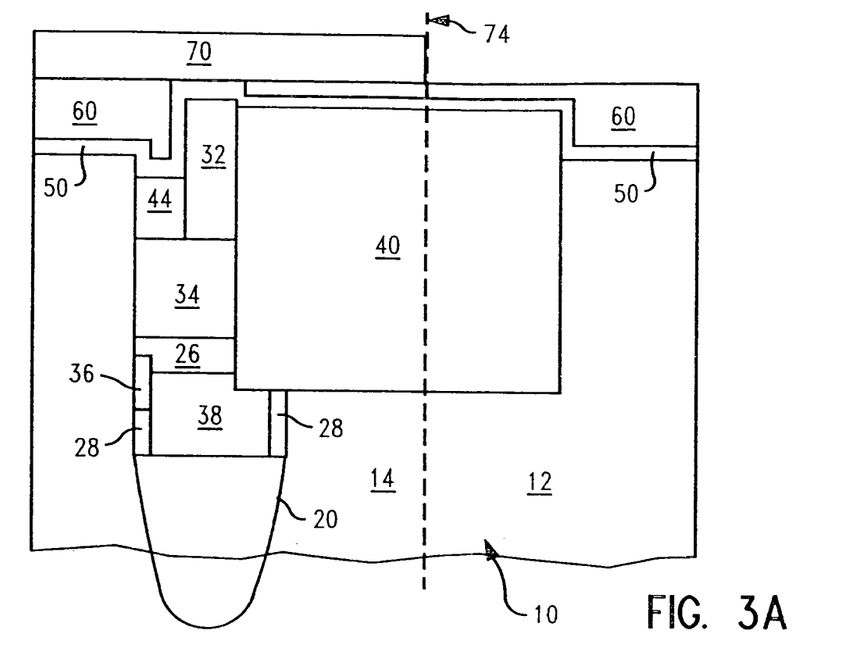
FIGS. 3A–B are partial cross-sectional views of FIG. 2 showing first and second embodiments of an array top oxide directly deposited over the top oxide nitride layer in both array and support areas for maintaining a height of the isolation trench, and subsequently processing the support area using an etch support (ES) mask that protects only the array area.
Figure 3B:
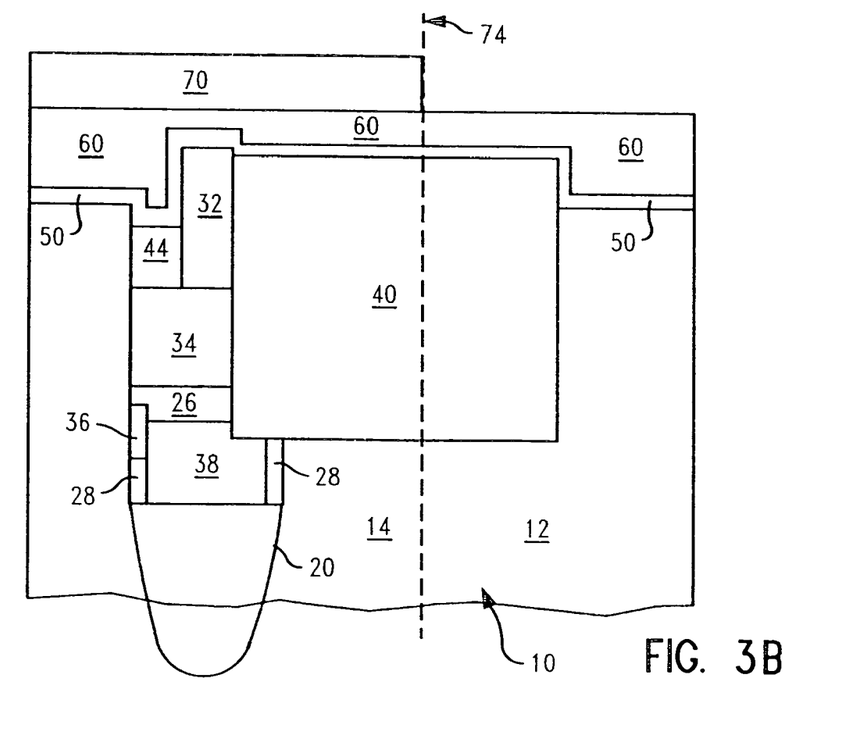

As shown in FIG. 2, a top oxide nitride liner (TON) 50 is conformally deposited over all exposed surface areas of the structure. That is, the TON 50 layer conformally coats both array areas 14 and support areas 12 of the substrate. TON liner 50 may comprise any suitable material that allows isolation between the isolation trench fill 40 and a subsequently deposited array top layer. Ideally, the material of the TON liner 50 is not attacked by HF chemistries. In the preferred embodiment, DRAM 100 includes oxide isolation trench 40, silicon nitride TON liner 50 and a subsequently deposited array top oxide (ATO) layer 60, as shown in FIGS. 3A–B. In an alternate embodiment, wherein the isolation trenches are filled with oxide, the TON liner 50 may comprise any known material other than oxide to allow for isolation between the isolation trench 40 and the subsequently deposited ATO layer 60.

Referring to FIGS. 3A–B, the ATO layer 60 is deposited over both array 14 and support 12 areas of the DRAM. The ATO layer 60 contacts and entirely covers the TON liner 50 within both the array and support areas. By depositing the ATO layer directly and entirely over the TON liner in accordance with the invention, the height of the isolation trench 40, as established by the prior step of polishing the isolation trench, is controlled and maintained at such height during subsequent processing steps of completion of the resultant DRAM.

Once the ATO layer 60 is deposited over all exposed surface areas of TON liner it is planarized, preferably, by chemical mechanical polishing. As shown in FIG. 3A, this planarization process may cease once it is determined that a top surface of at least a portion of the TON liner 50 is contacted and exposed, so as to leave remaining portions of ATO 60 in both array 14 and support 12 areas. Alternatively, as shown in FIG. 3B, the process of planarizing the ATO layer 60 may stop at a sufficient distance above TON liner 50. That is, in this embodiment the planarization stops at a sufficient distance within the ATO layer 60 in order to prevent damage to the underlying TON liner 50, that is, at a distance of greater than 0Å to about 200Å above the TON liner 50. Thus, in accordance with the invention, the process of planarizing the ATO layer 60 may be stopped at a distance ranging from about 0Å to about 200Å above the TON liner 50.

In either embodiment, once planarization of the ATO layer 60 is complete, an etch support (ES) photo resist layer is deposited over the surface of the substrate and patterned to form ES photo resist mask 70 only over the array areas 14 as shown in both FIGS. 3A–B. In so doing, the ES photo resist mask 70 exposes all support areas 12 of the substrate 10. Optionally, a polysilicon liner may be used to protect the ATO in the array, as disclosed in U.S. Pat. No. 6,509,226, the disclosure of which is hereby incorporated by reference.

Figure 4A:
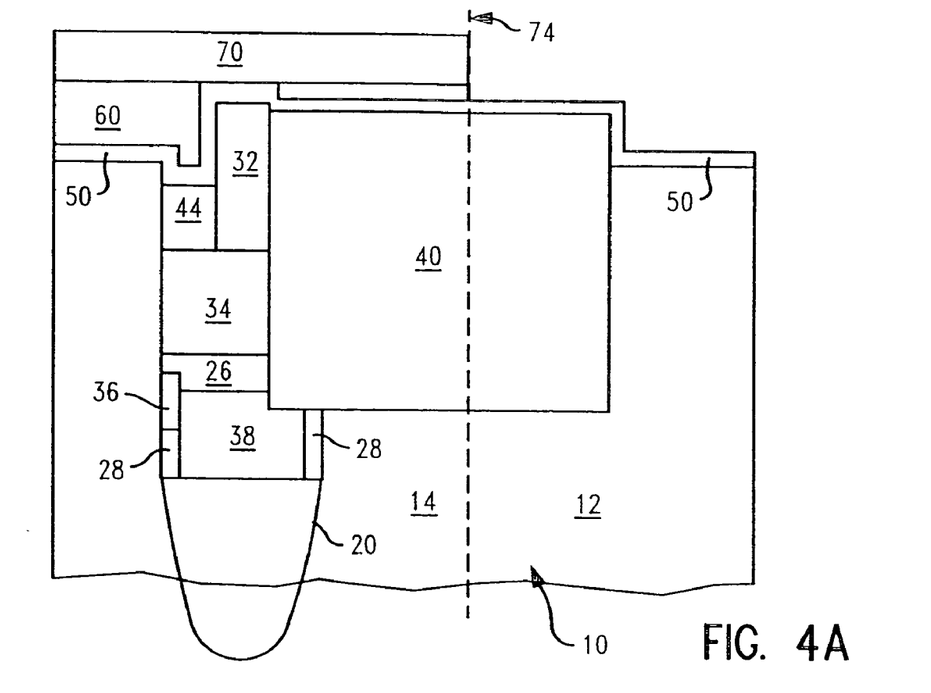
FIGS. 4A–B are partial cross-sectional views of FIGS. 3A–B showing both embodiments wherein the first embodiment illustrates the removal of ATO layer only from the support area and the second embodiment illustrates the removal of ATO layer only from the support area followed by the subsequent step of removing the etch support mask.
Figure 4B:
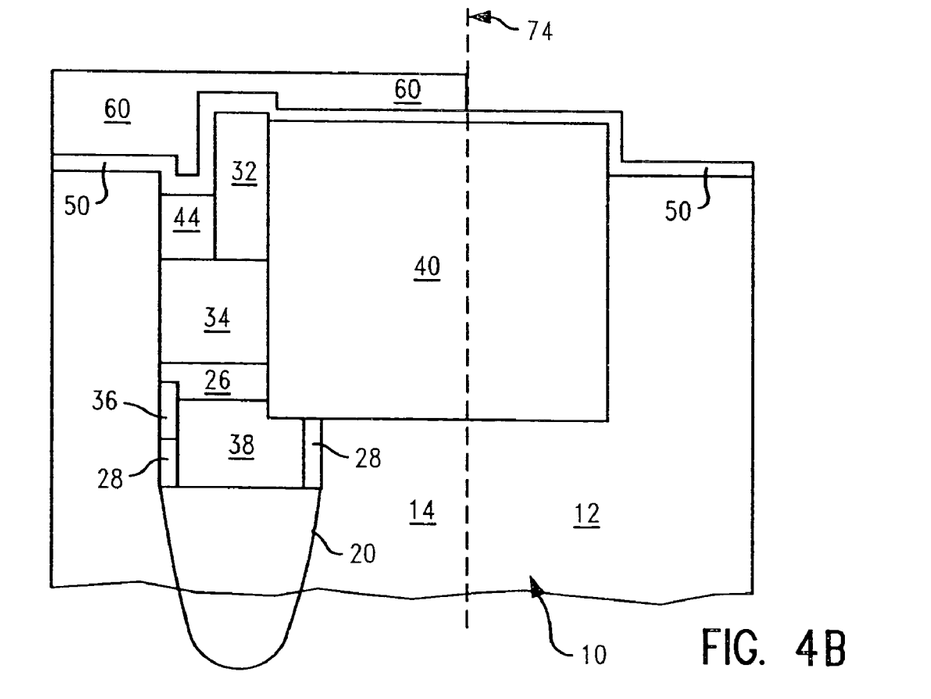

Referring now to FIGS. 4A–B, the exposed support areas 12 are then etched, by either an HF based wet etch or RIE, to remove the ATO layer 60 only in the support areas, thereby exposing TON liner 50 only within such support areas 12. During this process, the ES photo resist mask 70 protects the underlying layering within the array areas 14, while the TON liner 50 protects the underlying isolation oxide trench fill 40 from any chemicals used during such etch process. In the preferred embodiment, the ATO layer 60 is etched using an HF etchant chemistry whereby the silicon nitride TON liner 50 is not attacked by such HF etchant chemistry, therein protecting the underlying support area 12, and in particular, that portion of the isolation oxide trench 40 that lies within the support area.

Subsequently, the ES photo resist mask 70 is removed from the array area 14. In so doing, the ATO layer 60 is exposed only within the array area 14, while the TON liner 50 is exposed only within the support area 12 as shown in FIG. 4B.

This exposed TON liner 50 in the support area is then stripped from the support areas so as to leave remaining portions of TON liner 50 only within the array areas 14 of the substrate. In so doing, portions of the isolation trench oxide 40 and substrate 10 material are now exposed only in the support areas. Support regions may then be processed by etching the pad oxide in the support areas only, providing a sacrificial oxide layer, implanting such support regions and then stripping the sacrificial oxide layer, all by known techniques.

Figure 5:
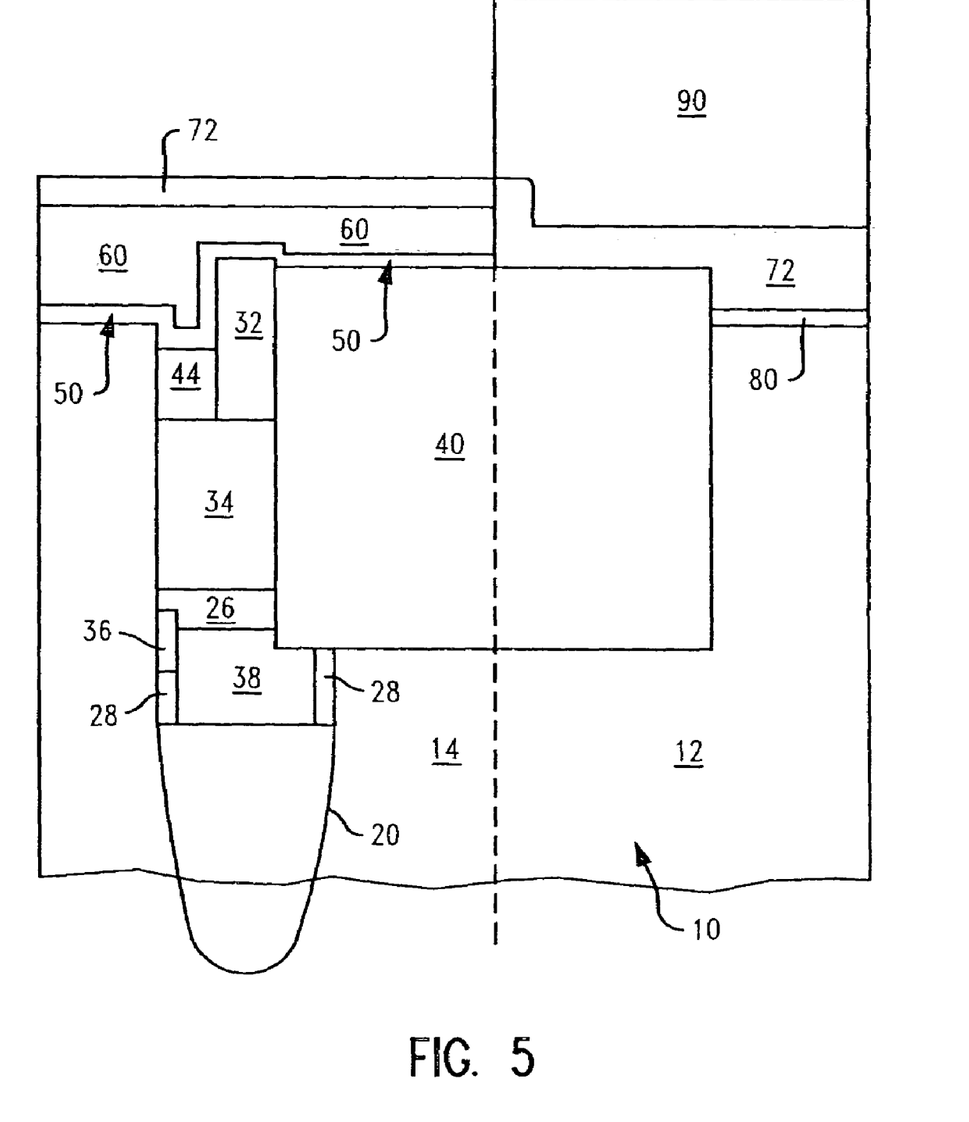
FIG. 5 is a partial cross-sectional view of FIG. 4B showing that an etch array (EA) mask protects underlying support area during recessing back of the array area.

Referring to FIG. 5, a gate oxidation layer 80 is then grown over the exposed substrate areas within the support area only. In this processing step of the invention, as the ATO layer 60 is exposed in the array area and portions of the isolation trench oxide 40 are exposed in the support area, an insignificant amount, if any, of oxide will grow over such layers. Preferably, the gate oxidation layer 80 is grown only over the exposed portions of the silicon substrate 10 in the support areas.

A gate polysilicon layer 72 is then deposited to a uniform thickness over both support and array areas as shown in FIG. 5. Once the deposition of gate polysilicon layer 72 is completed, a second mask, particularly an etch array (EA) mask 90, is formed over the support areas so as to completely cover only the support areas of the substrate. EA mask 90 is preferably formed by depositing a layer of resist over the surface of the DRAM, followed by developing and exposing the resist layer to form the photo resist EA mask 90 only over support areas 12.

Figure 6:
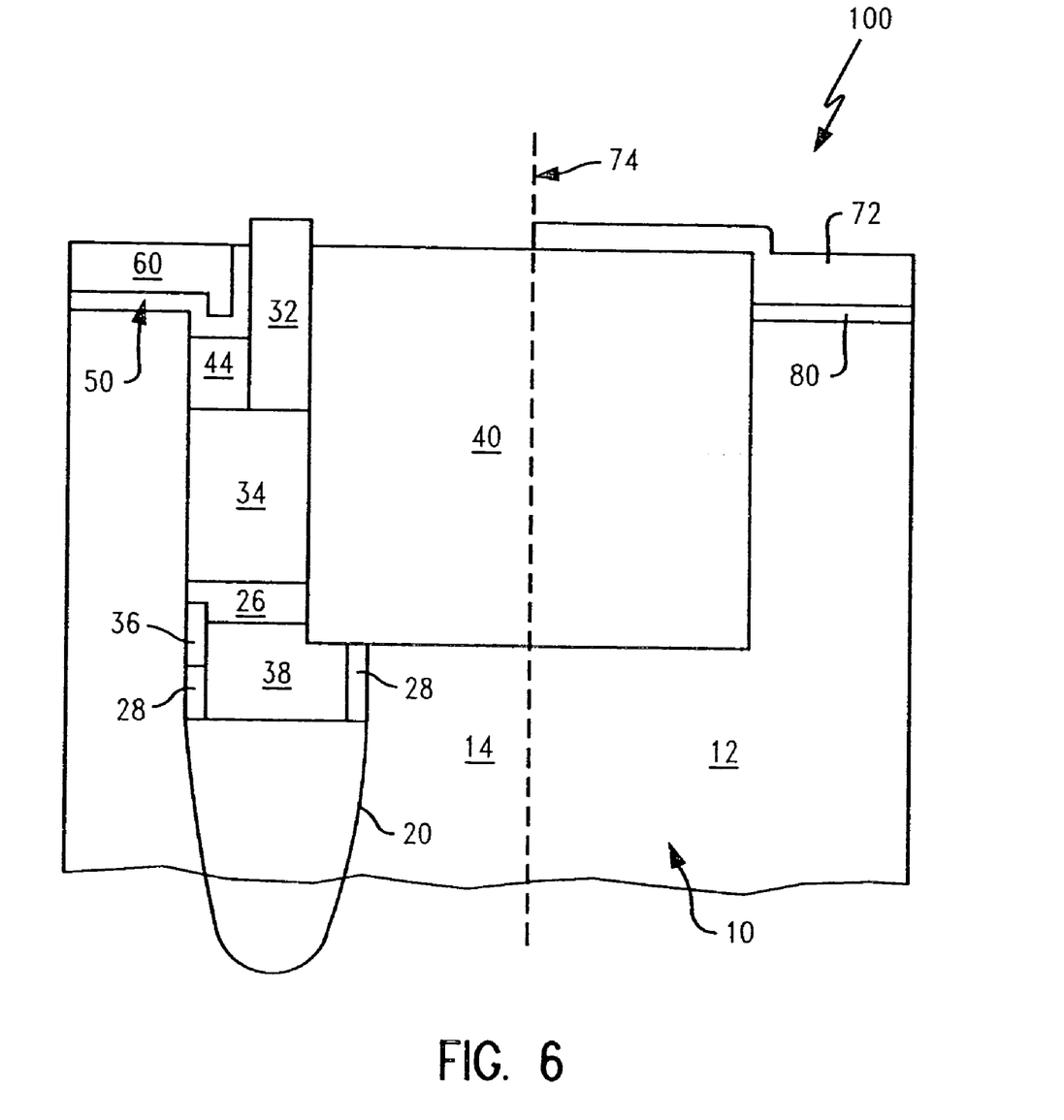
FIG. 6 is a partial cross-sectional view of FIG. 5 showing that the array area is etched back to expose the gate contact for subsequent DRAM processing.
Figure 7:
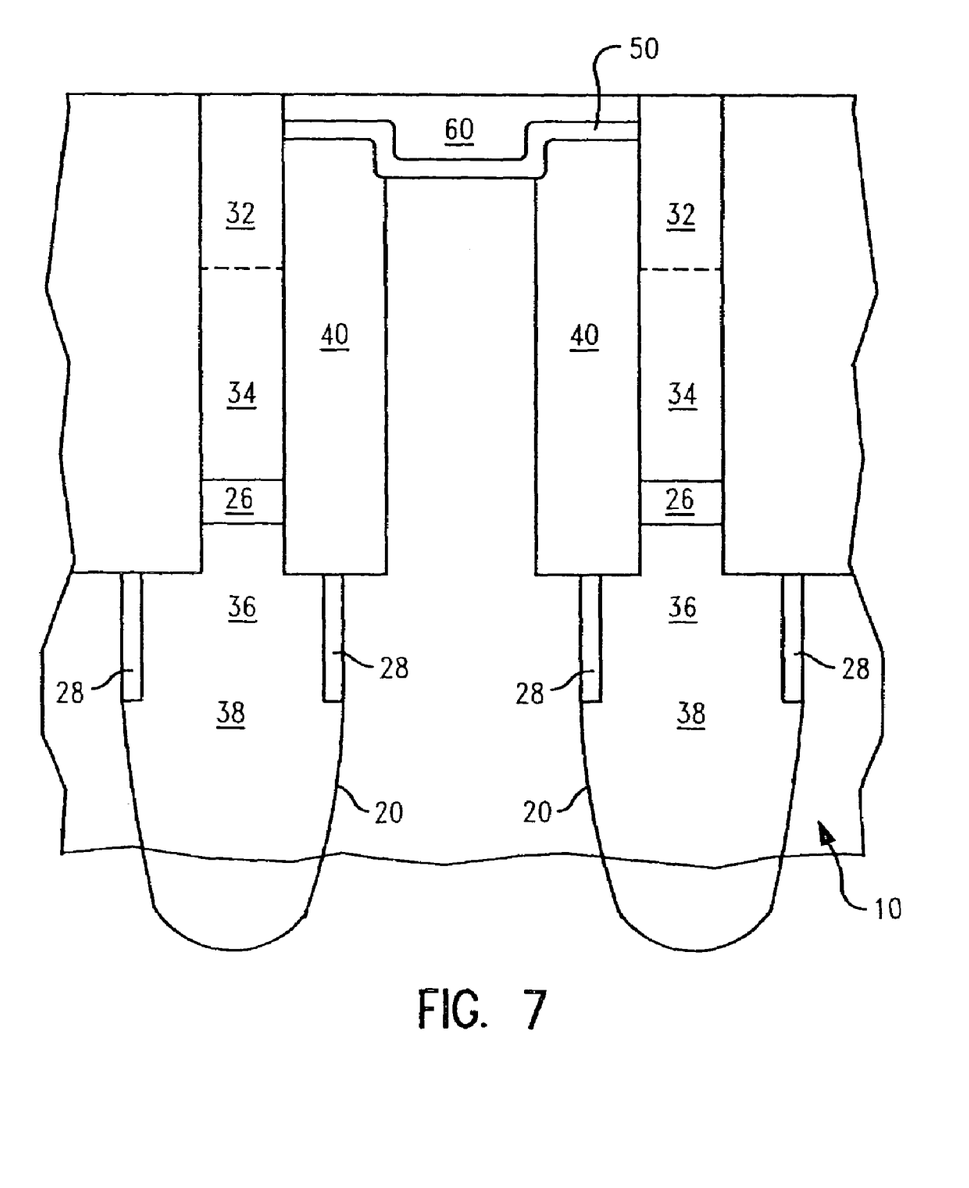
FIG. 7 is a partial orthogonal cross sectional view in the array of FIG. 6 showing the TON layer being directly between the ATO and the isolation trench fill.

Using the EA mask 90, the array area 14 is then processed by removing the portions of the gate polysilicon layer 72 residing within the array area, as well as removing portions of both ATO layer 60 and TON layer 50 only in the array area 14, as is shown in FIG. 6. In so doing, the vertical gate contact 32 is exposed within the array area and the ATO 60 and TON 50 layers reside only in the array areas of the DRAM. During this processing step, the gate polysilicon layer 72 protects the underlying support regions, and in particular, it protects the underlying isolation trench oxide 40 and grown oxide 80 in the support areas.

Referring to FIG. 6, the EA mask 90 is removed to leave remaining portions of the ATO 60 and TON 50 layers within array areas 14 only, the gate oxidation layer 80 and polysilicon layer 72 within support areas 12 only, and the isolation trench oxide 40 in both array and support areas. A critical feature of the invention is that this resultant intermediate DRAM structure of FIG. 6, includes a nitride liner within the array area, particularly, TON liner 50, separating and isolating remaining ATO layer 60, also within the array area, from the isolation trench oxide 40 residing in both array and support areas. Having the nitride liner between the ATO and the isolation trench oxide advantageously protects the isolation trench oxide from any divot opening etches during the above described processing steps of the invention, particularly wherein the TON liner 50 resides between the ATO and the isolation trench so as to completely cover the isolation trench oxide, while simultaneously maintaining the isolation trench oxide height fixed in the supports during the ATO process. This feature of the invention is shown more clearly in FIG. 7, which illustrates an orthogonal cross sectional view in the array of FIG. 6. As shown, the TON layer 50 is directly between the ATO 60 and the isolation trench fill 40.

Once the vertical polysilicon gate contact 32 is exposed to form the intermediate processing structure of FIG. 6, this intermediate structure may be provided with a gate stack (not shown). Further processing of the intermediate structure to completion continues using processing techniques as known and used in the art.

In accordance with the foregoing description of the invention, it should be recognized that the above-described embodiments of the invention are not limited solely to the fabrication of vertical DRAM cells, or even other types of memory cells for that matter. Rather, the invention embodiments may also be applicable to other types of semiconductor devices having first and second device areas, which may be processed differently. In these varying embodiments, essential features of the invention include, but are not limited to, a common pad SiN strip in support and array, the deposition of a TON liner followed by the immediate deposition of an ATO layer directly on the TON layer, stripping the composite layers of ATO over TON only in support areas using an ES mask covering array areas followed by the support gate oxidation step, and subsequently stripping at least a portion of the ATO/TON composite layers in the array area using an EA mask covering the support areas so as to expose the vertical gate contact for further DRAM processing.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An intermediate DRAM structure comprising:
   a vertical MOSFET structure having an array area and a support area;
   an isolation region within said array and said support areas;
   an array top oxide region only within said array area;
   a nitride liner within said array area residing between said array top oxide and said isolation region; and
   an electrically conductive contact having an exposed surface within said array area,
   wherein said vertical MOSFET structure has within said array area an array of trenches containing trench capacitors and vertical transistors, and has a surface over each of said trenches comprising a gate oxide of at least one adjacent isolation trench from a plurality of isolation trenches and said electrically conductive contact, and has within said support area at least said plurality of isolation trenches.

2. The intermediate product of claim 1 wherein said isolation region comprises an oxide isolation trench.

3. The intermediate product of claim 2 wherein said nitride liner comprises a top oxide nitride liner layer that allows isolation between said array top oxide and said isolation region.

4. The intermediate product of claim 3 wherein said top oxide with nitride liner layer comprises a silicon nitride layer that allows isolation between said array top oxide and said oxide isolation trench.

5. The intermediate product of claim 3 further including said top oxide with nitride liner layer residing between and in direct contact with both said array top oxide and said electrically conductive contact.

6. The intermediate product of claim 5 further including vertical sidewall spacers in said array area, said vertical sidewall spacers being in contact with and directly below portions of said top oxide with nitride liner layer.

7. An intermediate DRAM structure comprising:
a substrate having an array area and a support area;
an isolation region within said array and said support areas;
an array top oxide region only within said array area;
a top oxide nitride liner only within said array area, said top oxide nitride liner residing vertically between said array top oxide and said isolation region; and
an electrically conductive contact having an exposed surface within said array area.

8. The intermediate product of claim 7 wherein said substrate comprises a vertical MOSFET structure having within said array area an array of trenches containing trench capacitors and vertical transistors and having a surface over each of said trenches comprising a gate oxide of at least one adjacent isolation trench from a plurality of isolation trenches and said electrically conductive contact, and having within said support area at least said plurality of isolation trenches.

9. The intermediate product of claim 7 wherein said isolation region comprises an oxide isolation trench.

10. The intermediate product of claim 9 wherein said top oxide nitride liner layer comprises a silicon nitride layer.

11. The intermediate product of claim 7 wherein said top oxide nitride liner layer comprises a material that allows isolation between said isolation region and said array top oxide.

12. The intermediate product of claim 7 wherein said array top oxide comprises a material etchable by an HF etchant chemistry.

13. The intermediate product of claim 12 wherein said top oxide nitride liner layer comprises a material substantially not etchable by said HF etchant chemistry.

14. The intermediate product of claim 7 further including said top oxide nitride liner layer residing between and in direct contact with both said array top oxide and said electrically conductive contact.

15. The intermediate product of claim 7 further including vertical sidewall spacers in said array area, said vertical sidewall spacers being in contact with and directly below portions of said top oxide nitride liner layer.

16. The intermediate product of claim 7 further including a gate oxidation layer only within said support area.

17. The intermediate product of claim 7 further including a polysilicon layer only within said support area.

18. The intermediate product of claim 7 further including a gate stack of said intermediate DRAM structure for processing said intermediate DRAM structure into a final product.

* * * * *